(12) United States Patent
Miyata et al.

(10) Patent No.: US 7,888,170 B2
(45) Date of Patent: Feb. 15, 2011

(54) ELECTRONIC ELEMENT

(75) Inventors: Hirokatsu Miyata, Hadano (JP); Yohei Ishida, Kawasaki (JP); Yasuhiro Kawashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/631,460

(22) Filed: Dec. 4, 2009

(65) Prior Publication Data

US 2010/0078632 A1   Apr. 1, 2010

Related U.S. Application Data

(62) Division of application No. 11/437,786, filed on May 22, 2006, now abandoned.

(30) Foreign Application Priority Data

May 25, 2005   (JP) ............... 2005-152465

(51) Int. Cl.
*H01L 51/40* (2006.01)

(52) U.S. Cl. .......... 438/99; 257/E51.006; 257/E51.023; 977/893

(58) Field of Classification Search ............ 257/40, 257/E51.001–E51.052; 438/99; 977/781, 977/795, 882–883, 893, 936–938
See application file for complete search history.

(56) References Cited

U.S. PATENT DOCUMENTS

| 5,546,889 | A | 8/1996 | Wakita et al. |
| 5,556,706 | A | 9/1996 | Wakita et al. |
| 5,912,473 | A | 6/1999 | Wakita et al. |
| 6,846,546 | B2 | 1/2005 | Kuroda et al. |
| 6,984,414 | B2 | 1/2006 | Miyata |
| 7,203,606 | B2 | 4/2007 | Nakano et al. |
| 7,211,463 | B2 | 5/2007 | Hu et al. |
| 7,345,296 | B2 * | 3/2008 | Tombler et al. ............. 257/9 |

(Continued)

FOREIGN PATENT DOCUMENTS

JP   7-206599   8/1995

(Continued)

OTHER PUBLICATIONS

Wu, J., et al. "Host-Guest Chemistry Using an Oriented Mesoprous Host: Alignment and Isolation of a Semiconducting Polymer in the Nanopores of an Ordered Silica Matrix." J. Phys. Chem. B, vol. 103 (1999): pp. 2374-2384.*

(Continued)

*Primary Examiner*—Matthew W Such
(74) *Attorney, Agent, or Firm*—Fitzpatrick, Cella, Harper & Scinto

(57) ABSTRACT

The object is to fabricate a novel organic semiconductor element which can effectively utilize the main-chain conduction of a conjugated high molecular compound having semiconductor-like properties. Provided is an electronic element which contains, as components, a pair of electrodes which is formed on a substrate, a mesoporous film in which tubular mesopores, which are orientation controlled in one direction, are formed, the mesoporous film being formed between the electrodes so as to be in contact with the electrodes, a conjugated high molecular compound held in the tubular mesopores, and a third electrode which is electrically insulated from the conjugated high molecular compound and is in contact with the mesoporous film.

10 Claims, 6 Drawing Sheets

U.S. PATENT DOCUMENTS

| | | |
|---|---|---|
| 7,413,792 B2 | 8/2008 | Miyata et al. |
| 7,432,525 B2 | 10/2008 | Mizusaki et al. |
| 7,615,775 B2 | 11/2009 | Wada et al. |
| 7,618,703 B2 | 11/2009 | Miyata et al. |
| 2002/0041932 A1 | 4/2002 | Ogawa |
| 2002/0127386 A1 | 9/2002 | Ogawa et al. |
| 2005/0019547 A1 | 1/2005 | Miyata et al. |
| 2005/0256224 A1 | 11/2005 | Miyata et al. |
| 2006/0014028 A1 | 1/2006 | Ogawa |
| 2006/0033098 A1 | 2/2006 | Shih et al. |
| 2006/0057296 A1 | 3/2006 | Ogawa et al. |
| 2006/0057357 A1 | 3/2006 | Miyata et al. |
| 2006/0062909 A1 | 3/2006 | Miyata |
| 2006/0147677 A1 | 7/2006 | Miyata et al. |
| 2006/0240245 A1 | 10/2006 | Ishida et al. |
| 2007/0023289 A1 | 2/2007 | Miyata et al. |
| 2007/0281385 A1* | 12/2007 | Wade et al. .................. 438/99 |

FOREIGN PATENT DOCUMENTS

| | | |
|---|---|---|
| JP | 9-246921 | 9/1997 |
| JP | 2000-233995 | 8/2000 |
| JP | 2001-58812 | 3/2001 |
| JP | 2003-298067 | 10/2003 |

OTHER PUBLICATIONS

Hongyou Fan, et al., "Rapid prototyping of patterned functional nanostructures", Nature, vol. 405, May 4, 2000, pp. 56-60.

Yunfeng Lu, et al., "Continuous formation of supported cubic and hexagonal mesoporous films by sol-gel dip-coating", Nature, vol. 389, Sep. 25, 1997, pp. 364-368.

Hirokatsu Miyata, et al., "Preparation of Mesoporous Silica Films with Fully Aligned Large Mesochannels Using Nonionic Surfactants", Chem. Mater., vol. 14, No. 2, 2002, pp. 766-772.

William C. Molenkamp, et al., "Highly Polarized Luminescence from Optical Quality Films of a Semiconducting Polymer Aligned within Oriented Mesoporous Silica", Journal of the American Chemical Society, vol. 126, No. 14, 2004, pp. 4476-4477.

Thuc-Quyen Nguyen, et al., "Control of Energy Transfer in Oriented Conjugated Polymer-Mesoporous Silica Composites", Science, vol. 288, Apr. 28, 2000, pp. 652-656.

Romano J. O. M. Hoofman, et al., "Highly mobile electrons and holes on isolated chains of the semiconducting polymer poly(phenylene vinylene)", Nature, vol. 392, Mar. 1998, pp. 54-56.

Benjamin Hatton, et al., "Past, Present, and Future of Periodic Mesoporous Organosilicas—The PMOs", Accounts of Chemical Research, vol. 38, 2005, pp. 305-312.

* cited by examiner

ELECTRONIC ELEMENT

This application is a divisional of application Ser. No. 11/437,786, filed May 22, 2006, the contents of which are incorporated herein by reference.

BACKGROUND OF THE INVENTION

1. Field of the Invention

The present invention relates to an electronic element and, particularly, to a novel organic semiconductor element which uses a conjugated high molecular compound, more particularly, to a field-effect transistor which uses an organic semiconductor.

More specifically, the invention relates to an electronic device which utilizes the main-chain conduction of a conjugated high molecular compound which is orientation controlled at a molecular level.

2. Related Background Art

Organic semiconductors have various possibilities, such as the realization of low cost processes and flexible devices, and recent years have seen very active research and development aimed at the application of electronic devices, such as electroluminescence elements and field-effect transistors (FETs).

Organic semiconductors used in electronic devices are broadly divided into low molecular compounds and high molecular compounds.

For example, complexes, such as copper and phtalocyanine, and polycyclic organic compounds, such as pentacene, are used as low molecular compounds, and thin film designs are obtained by techniques such as evaporation, whereby devices are fabricated.

In contrast to low molecular compounds, high molecular compounds have a structure in which conjugated double bonds are continuous as in polythiophene, polypyrrole, polyacetylene and the like, and they are used in fabricating devices by techniques such as printing.

In the case of low molecular compounds, almost all molecules have a structure in which the molecules are stacked due to interactions by Π electrons, and carriers migrate by hopping conduction among the molecules.

In many cases, in-plane orientation directions are at random. However, it has been reported that anisotropy in electrical conductivity can be observed by arraying molecules in a specific direction.

A technique which has accomplished an improvement in the characteristics of an FET by orienting low molecular compounds is disclosed in the Japanese Patent Application Laid-Open No. H07-206599, for example.

In conjugated high molecular compounds, ideally, Π electrons are delocalized throughout the molecules, and hence conjugated high molecular compounds have high carrier mobility within the molecules.

Among polymer chains, carriers migrate by hopping conduction.

At present, almost all polymer chains are used in a random condition in which they are not orientation controlled, and hopping conduction is a main conduction mechanism.

However, even in hopping conduction, it is possible to increase carrier mobility by aligning the orientation direction of molecules, and the Japanese Patent Application Laid-Open No. H09-246921 discloses a structure in which fibrils with aligned directions of polymer chains are formed so as to be orthogonal to the direction of an electrode.

Also, there have been proposed several techniques which involve providing protection from deterioration reactions and the like by introducing a conjugated high molecular compound as a guest into an inorganic or organic host material.

The object of these techniques is to prevent the attack of high molecular compounds by oxygen, water and the like.

A technique which uses cyclodextrin as a host material is disclosed in the Japanese Patent Application Laid-Open No. 2003-298067.

There are also several reports on techniques for introducing a conjugated high molecular compound into the pores of mesoporous silica.

In "Science," Vol. 288, p. 652, there is a report to the effect that poly[2-methoxy-5-(2'-ethylhexyloxy)-1,4-phenylene vinnylene] (abbreviated as MEH-PPV), which is a conjugated polymer, is introduced in the mesopores of mesoporous silica monolith for which the orientation direction is controlled by the application of a ferromagnetic field.

However, the above-described techniques had several problems as described below.

That is, in the case of the method described in Non-patent Document 1, the mesoporous silica monolith contains many fine cracks and its application to electronic elements was difficult.

Also, the shown orientation distribution of pores was wide and it could not be said that the orientation controllability is high. Furthermore, the form of a monolith was not suitable for the fabrication of devices.

SUMMARY OF THE INVENTION

Against the above-described technical background, the present invention has been made in view of the above-described problems, and the invention can fabricate, by a simple process, a novel high-performance electronic element in which by forming a conjugated high molecular compound in a highly anisotropic space of an oriented mesoporous film, the direction of polymer chains is controlled on a macroscopic scale and high carrier mobility by main-chain conduction is utilized.

According to an aspect of the present invention, there is provided an electronic element, comprising:

a pair of electrodes formed on a substrate;

a mesoporous film having tubular mesopores oriented in one direction, the mesoporous film being formed between the pair of electrodes so as to be in contact with the pair of electrodes;

a conjugated high molecular compound held in the tubular mesopores; and a third electrode which is electrically insulated from the conjugated high molecular compound and formed so as to be in contact with the mesoporous film.

The orientation direction of the tubular mesopores is preferably parallel to the direction of an electric field when an electrical potential is applied across the pair of electrodes.

The electronic element is preferably a field-effect transistor which controls the amount of a current flowing across the pair of electrodes by an electrical potential applied to the third electrode. In the electronic element, a material for the mesoporous film is preferably silica. Alternatively, in the electronic element, a material for the mesoporous film is preferably a hybrid material of silica and an organic substance.

In the electronic element, a material for the mesoporous film preferably contains a silicon oxide.

In the electronic element, at least a portion of the substrate is preferably a substrate having electrical conductivity and the substrate serves also as the third electrode.

According to another aspect of the present invention, there is provided a method of manufacturing the electronic element, wherein a step of forming a conjugated high molecular compound in tubular mesopores which are orientation controlled comprises:

a step of forming a mesoporous film which is made up so as to contain tubular molecular assemblies of a surfactant having a uniform diameter, which are oriented in one direction;

a step of removing the surfactant from the pores of the mesoporous film;

a step of performing treatment so that pore surfaces of the mesoporous film after removal of the surfactant obtain hydrophobicity; and a step of introducing the conjugated high molecular compound subsequently to the hydrophobicizing treatment.

According to still another aspect of the present invention, there is provided a method of manufacturing the electronic element, wherein a step of forming a conjugated high molecular compound in tubular mesopores which are orientation controlled comprises:

a step of forming a mesoporous film which is made up so as to contain tubular molecular assemblies of a surfactant having a uniform diameter, which are aligned in one direction, by use of a surfactant having a functional group capable of forming a conjugated high molecular compound by polymerization; and a step of forming a conjugated high molecular compound by causing a surfactant in the mesoporous film to polymerize.

According to a further aspect of the present invention, there is provided a method of manufacturing an electronic element, comprising:

a step of forming a mesoporous film having tubular mesopores, which are orientation controlled in one direction, on a substrate;

a step of forming a conjugated high molecular compound in the orientation controlled tubular mesopores;

a step of forming a pair of electrodes for forming an electric field parallel to the direction of the pores so as to be in contact with the mesoporous film having tubular mesopores in which a conjugated high molecular compound is formed; and a step of forming a third electrode which is electrically insulated from the conjugated high molecular compound and is in contact with the mesoporous film.

According to a further aspect of the present invention, there is provided a method of manufacturing an electronic element, comprising:

a step of preparing a substrate which has an electrically conductive part in at least a portion of a surface thereof;

a step of forming a mesoporous film having tubular mesopores, which are orientation controlled in one direction, on the electrically conductive part of the substrate;

a step of forming a conjugated high molecular compound in the tubular mesopores, which are orientation controlled; and a step of forming a pair of electrodes for forming an electric field parallel to the direction of the pores so as to be in contact with the mesoporous film having tubular mesopores in which a conjugated high molecular compound is formed.

According to the present invention, it is possible to fabricate a novel organic semiconductor element in which by the orientation control of a conjugated high molecular compound in an oriented nanospace of mesoporous silica, the main-chain conduction of the conjugated high molecular compound having semiconductor-like properties.

DETAILED DESCRIPTION OF THE PREFERRED EMBODIMENT

Most preferred modes for carrying out the present invention will be described below by referring to the accompanying drawings.

Figure 1:
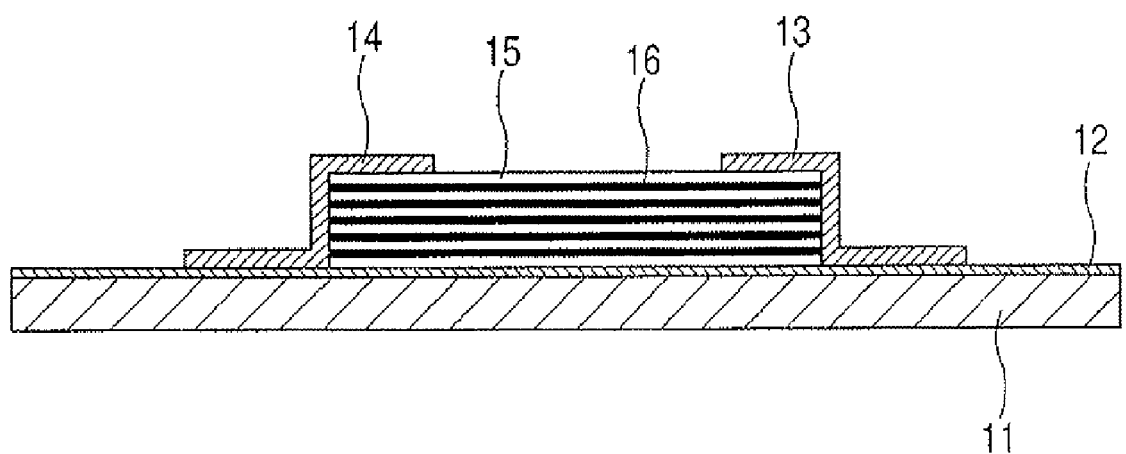
FIG. 1 is a schematic diagram to explain a preferred mode of an electronic element of the present invention.

FIG. 1 is a diagram which schematically shows a preferred mode of an electronic element of the present invention.

In FIG. 1, the reference numeral 11 denotes a substrate having electrical conductivity on its surface, the reference numeral 12 denotes an insulating film, the reference numeral 13 denotes an electrode (source), the reference numeral 14 denotes an electrode (drain), the reference numeral 15 denotes a mesoporous film, and the reference numeral 16 denotes a tubular mesopore holding a conjugated high molecular compound.

Figure 2:
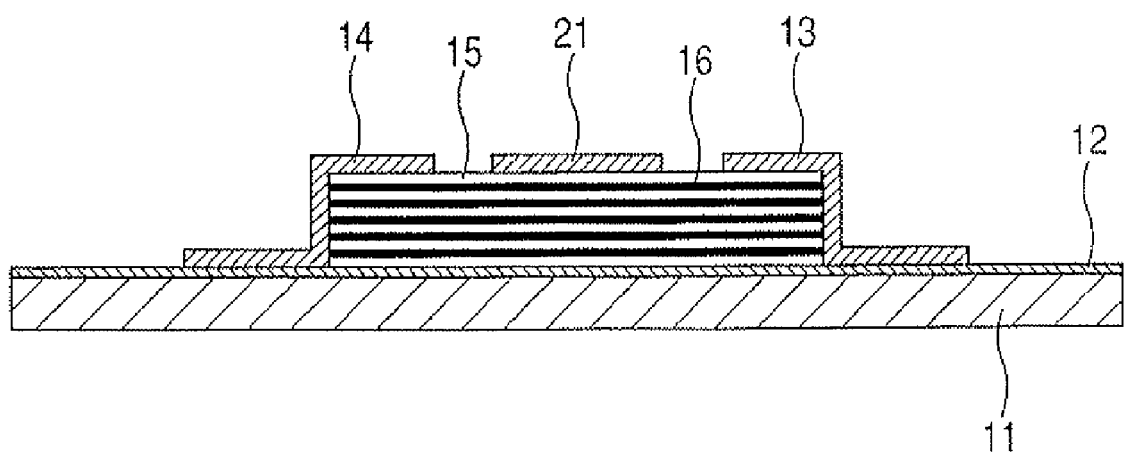
FIG. 2 is a schematic diagram to explain another preferred mode of an electronic element of the present invention.

FIG. 1 shows a structure in which the substrate surface has electrical conductivity and functions as a gate electrode. However, in an electronic element of the present invention, as shown in FIG. 2, the structure may be such that a gate electrode 21 is formed on a mesoporous film, which is formed on an insulating substrate and carries conjugated polymers.

The gate electrode may be formed in such a manner as to surround the film.

The greatest feature of the present invention resides in that tubular mesopores having a uniform diameter are orientation controlled in one direction in the plane of a mesoporous film, and that conjugated polymers having semiconductor-like properties are orientation controlled, with the molecular chains aligned in the direction of pores, in a highly anisotropic nanospace having the orientation.

An electronic element of the structure shown in FIG. 1 will be described in the order according to a procedure for manufacturing the element.

In the manufacture of an element of the present invention, first, a mesoporous film having oriented tubular mesopores is prepared on a substrate.

First, the mesoporous film will be described.

Pores of the mesoporous film of the present invention are formed by the molecular assemblies of a surfactant (micelles), and pores of the same diameter are formed because the number of associations forming micelles is the same under some conditions.

Although various configurations, such those of a sphere, a tube and layer, are known as the shapes of micelles, the shape of the micelles which form a mesoporous film related to the present invention is basically tubular.

The mesopores mentioned in the present invention refer to pores having diameters in the range of 2 nm to 50 nm, according to the definition by IUPAC.

In a mesoporous silica film of the present invention, pores have a substantially uniform diameter.

The pores of uniform diameter mentioned here suggest that the pore distribution found by a technique for calculating pore diameter from the results of a measurement of nitrogen gas adsorption has a single maximum value, and that in this pore diameter distribution, not less than 60% of pores are included in a range having a width of 10 nm.

The pore diameter distribution is calculated by analytic methods, such as the Barrett-Joyner-Halenda (BJH) method, from an obtained isothermal adsorption curve.

A range having a width of 10 nm is a range of width in which the difference between a minimum value and a maximum value is 10 nm, as in the case of 2 nm to 12 nm, for example.

As used herein, the term "mesoporous film" refers to a mesoporous film which has hollow pores. In the present invention, however, this term is used as a term including a mesoporous film having a structure in which an organic guest species, a surfactant and the like are held within pores.

A mesoporous film of the present invention may have the structural feature that tubular mesopores are orientation controlled in one direction and that as will be described later, conjugated polymer chains be held in the nanospace of the mesoporous film.

Materials containing silicon oxides are preferably used as materials for forming pore walls of a porous material.

Particularly, silica or hybrid materials of silica and organic substances are particularly preferably used.

"Hybrid" here is not at least a mixture and refers to a hybrid compound material in which inorganic components and organic components are bonded by covalent bonds, for example, as in O—Si—C—Si—O.

In a mesoporous film of the present invention, the orientation direction of pores in the plane is specified in one direction by the structural anisotropy of the surface of a substrate.

The structural anisotropy of the surface of a substrate refers to, for example, the anisotropy of the atomic arrangement on a specific crystal plane on a crystalline substrate, the anisotropy of an irregular structure formed on a substrate, the structural anisotropy within a high molecular compound film formed on a substrate and the like.

In the case shown in FIG. 1 where a substrate serves also as a gate electrode, it is necessary that an appropriate part of the substrate have electrical conductivity. Basically, however, any substrate can be used.

In the case of the structure shown in FIG. 2, the selection range of substrates is wider.

Substrates applicable to the present invention will be described in further detail.

First, a crystalline substrate having anisotropy in the atomic arrangement on the surface will be described.

As a crystal plane having anisotropy in the atomic arrangement on the surface, for example, the (110) plane of a single crystal substrate having a crystal structure which is the diamond structure or a single crystal substrate having a crystal structure which is the zinc-blend type structure is preferably used, and particularly, the (110) plane of silicon is preferably used.

Because on these surfaces a specific orientation direction of atoms is uniquely determined, these surfaces have the capacity to orient surfactant assemblies.

The orientation control of pores of a silica mesostructure obtained by using a substrate in which the atomic arrangement on the surface has double symmetry, such as the (110) plane of silicon single crystal, has been discovered by the present inventors and described in the Japanese Patent Application Laid-Open No. 2000-233995.

In using these substrates, it is necessary that a clean crystal surface be exposed.

For example, in the case of a silicon substrate, it is necessary to remove a natural oxide film present on the surface.

The purpose is relatively simple to accomplish in a simple process, such as treating the surface in dilute hydrofluoric acid for several minutes.

For example, the (110) plane of a highly doped silicon single crystal has sufficiently low resistance, ant it is easy to impart the function of a gate electrode to this surface.

Next, a description will be given of a substrate on which a high molecular compound film having structural anisotropy is formed.

The Langmuir-Blodgett method and the rubbing method will be described here. However, techniques other than these methods can be used so long as they can form a high molecular compound having structural anisotropy on a substrate.

These methods have universality, because in a case where this high molecular compound film having structural anisotropy is to be formed, these methods can make similar surface conditions even when any material is used as a substrate to be used in the front-end.

When the function of a gate electrode is imparted to a substrate as shown in FIG. 1, a highly doped silicon wafer, a glass substrate on which a metal of low activity such as gold is evaporated, etc. can be used as a substrate on which a polymer film is formed.

First, the Langmuir-Blodgett method, i.e., a method by which a Langmuir-Blodgett film (an LB film) of a high molecular compound is formed will be described.

An LB film is a film which is obtained by transferring a monomolecular film developed on a water surface onto a substrate, and it is possible to form a film of a desired number of layers by repeating film formation.

The LB film mentioned in the present invention includes a monomolecular cumulative film of LB film derivatives, the chemical structure of which is changed, with a cumulative structure maintained, by subjecting an LB film formed on a substrate to treatment, such as heat treatment.

For example, a polyimide LB film can be prepared by developing an alkylamine salt of polyamic acid on a water surface, laminating films by the LB method and then performing heating.

It has been made clear by an infrared absorption analysis and the like that in a polyimide LB film thus prepared, polymer chains are oriented parallel to the drawing-up direction of the substrate during LB film preparation.

Because of this structural anisotropy of the polymer film of the substrate surface, the substrate on which the LB film of a high molecular compound ensures that the tubular mesopores of a mesoporous film formed on the substrate can be orientation controlled in one direction.

This technique has been discovered also by the present inventors and described in the Japanese Patent Application Laid-Open No. 2001-058812.

Subsequently, a description will be given of a substrate on which a high molecular compound film subjected to rubbing treatment is formed.

This substrate on which a high molecular compound film subjected to rubbing treatment is preferably used in preparing a mesoporous film having oriented tubular mesopores used in the present invention.

In rubbing treatment, a substrate is coated with a polymer by techniques such as spin coating and this coated substrate is rubbed with a cloth and the like in one direction.

A rubbing cloth is wound around a roller, and the roller which is rotating is brought into contact with the substrate surface and rubbing is performed by moving a stage to which the substrate is fixed in one direction with respect to the roller.

A rubbing cloth most suited to a polymer material which is used is selected. However, general cloths of nylon, rayon and the like can be used.

The rubbing strength is optimized by parameters, such as the number of revolutions of a roller, the strength with which the roller is pressed against a substrate, and the moving speed of a stage to which the substrate is fixed.

For a high molecular compound which is subjected to rubbing treatment, basically, materials are not limited so long as they can withstand a forming process of a mesostructure film, which will be described layer, and permit the orientation control of pores in the mesostructure. Polyimide and the like are preferably used.

Two types of structural anisotropies are induced by rubbing treatment in a high molecular compound film on the substrate surface.

In one type, by strongly rubbing the surface of a polymer film with a cloth, fine irregularities are formed on the surface. This irregular structure has high anisotropy because the surface is rubbed in one direction by use of a roller.

In another type, a polymer compound is elongated while being heated by the heat generated during rubbing treatment to above its glass transition point. This causes the sequence anisotropy of polymer chains.

The present inventors consider that the former type is induced in almost all high molecular compound films by rubbing treatment, whereas the latter type is induced under some conditions from a relative relationship between the physical properties based on the structure of polymer chains and rubbing conditions.

Also in this substrate subjected to rubbing treatment, because of the anisotropy of the structure of the surface, it is possible to perform the orientation control of the tubular mesopores in a mesoporous silica film formed on the substrate in one direction.

Also this technique has been discovered by the present inventors and described similarly in the Japanese Patent Application Laid-Open No. 2001-058812.

Next, methods of preparing a thin film of a mesostructure on a substrate will be described.

Methods of preparing a mesostructure film on a substrate are broadly divided into two methods.

One is based on nonuniform nucleation-nucleus growth from the inside of a solution to the surface of a substrate, and the other is a method called a solvent evaporation method based on the sol-gel method.

The former is described, for example, in "Chemistry of Material," Vol. 14, pp. 766-772, and the latter is described, for example, in "Nature," Vol. 389, pp. 364-368.

First, a description will be given of a method based on nonuniform nucleation-nucleus growth from the inside of a solution to the surface of a substrate.

This method is mainly used in the preparation of a mesoporous silica film, and a thin film of a mesostructure is prepared by using a method similar to crystal growth.

Under this method, by holding the above-described substrate in a precursor solution, which is obtained by adding a substance which becomes a raw material for the aimed pore wall forming material, to an aqueous solution of a surfactant, a mesoporous film is formed on the substrate.

Figure 3:
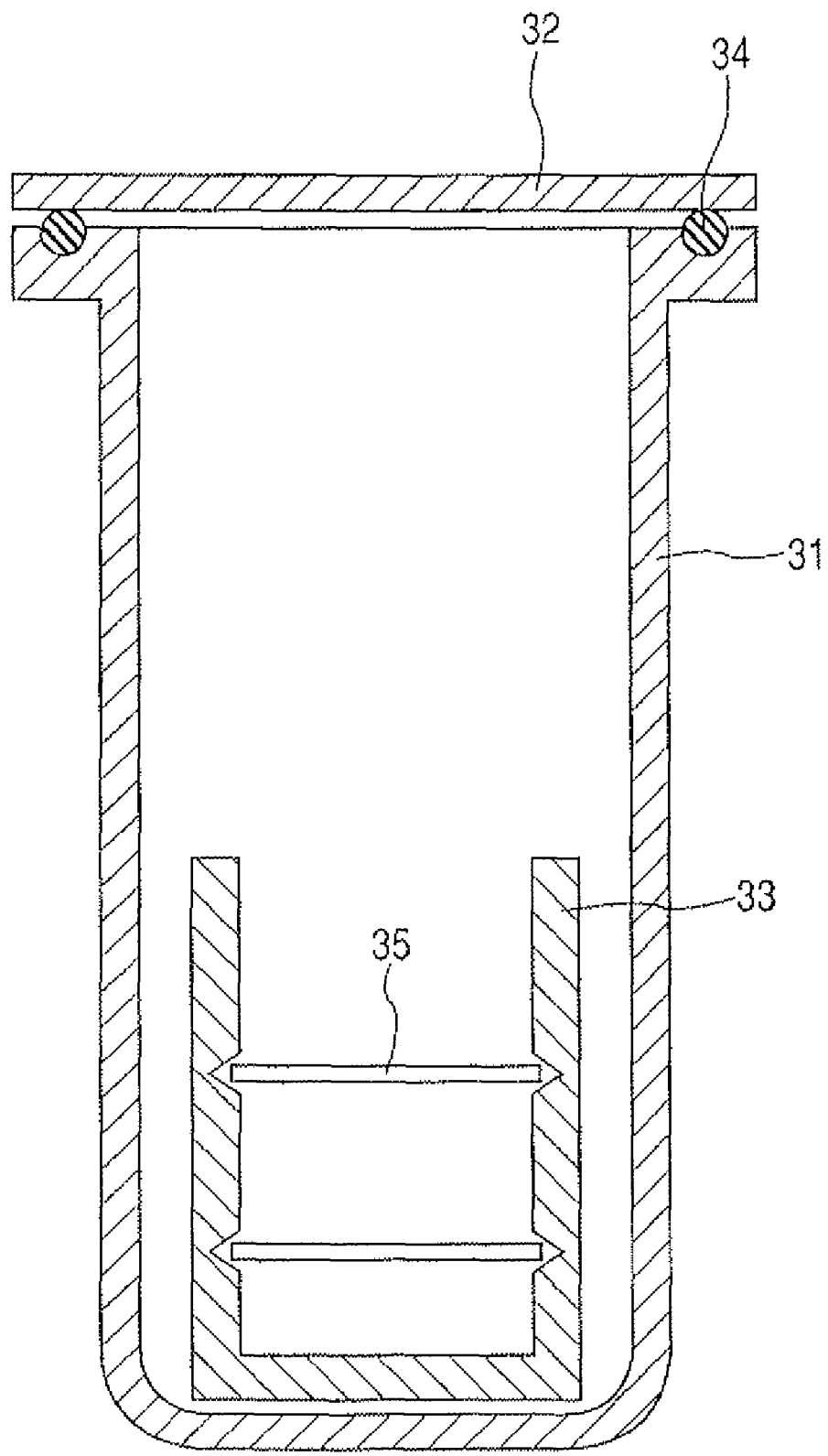
FIG. 3 is a schematic diagram of a reaction vessel to prepare a mesoporous film by the nonuniform nucleation-nucleus growth method.

A reaction vessel used in the formation of a mesostructure film by this method has a construction as shown in FIG. 3, for example.

Materials for the reaction vessel 31 are not especially limited so long as they have no effect on reactions, and materials such as polypropylene and Teflon (registered trademark) can be used.

In order that the reaction vessel is not broken under pressure during reactions, the reaction vessel may sometimes be further contained in a closed vessel made of a material of high rigidity, such as stainless steel.

In the reaction vessel, a substrate holder 33 is placed as shown in FIG. 3, for example, and a substrate 35 is held by using this holder. Reference numeral 32 denotes a lid, and reference numeral 34 denoted an O ring.

During reactions, the formation of a mesostructure occurs not only on the substrate, but also in the solution. Therefore, precipitates in the solution accumulate on the substrate.

In order to prevent this, during reactions the substrate is held in the solution, with its surface on which a film is formed faced downward.

The reaction solution is a solution which contains a surfactant and a substance which becomes a raw material for the aimed inorganic material, such as alkoxide.

According to the material which forms pore walls, an appropriate amount of an acid or the like, which is a hydrolysis reaction catalyst of raw materials for inorganic components, may sometimes be added.

When alkoxide is used, those in which alcohols formed as a result of hydrolysis are soluble in water are preferably used.

For example, when pore walls are made of silica, the reaction solution is adjusted by adding tetraethoxysilane or tetramethoxysilane to an acidic aqueous solution of a surfactant.

A surfactant to be used is appropriately selected according to a method of introducing a conjugated high molecular compound into pores.

As will be described later in detail, when a method of introducing a conjugated high molecular compound into hollow pores after the removal of a surfactant in the pores is adopted, it is possible to use a broad range of surfactants, such as a cationic surfactant, for example, quaternary alkyl ammonium, and a nonionic surfactant containing polyethylene oxide as a hydrophilic group, and surfactants are not especially limited.

The length of the molecules of the surfactant to be used is determined according to the pore diameter of the aimed mesostructure, and additives such as mesitylene may be added in order to increase the diameter of the surfactant micelles.

On the other hand, in a case where a conjugated high molecular compound is formed by directly performing a polymerizing reaction by use of a surfactant having a polymerizing part, a surfactant which has a polymerizing part, a suitable hydrophoric group and a suitable hydrophilic group is used after it is designed and synthesized to suit the aimed pore structure.

Also in the latter case, it is possible to make a wide selection of structures of a polymerizing part and structures of a hydrophilic group which are to be used.

For the acid to be used, it is possible to use general acids, such as hydrochloric acid and nitric acid.

The shape and structure of a film which precipitates on a substrate are not only greatly affected by the concentrations of a surfactant, an acid and raw materials for inorganic components, but also influenced by the properties of the substrate surface.

Therefore, it is necessary to perform film formation by optimizing the composition of a reaction solution according to the substrate to be used.

Under such conditions a mesoporous material can be deposited on the substrate.

Temperatures at which a mesoporous material is deposited are not especially restricted, and they are selected in the temperature range of room temperature to 100° C. or so.

The reaction time is several hours to several months, and there is a tendency that the longer the time, the larger the thickness of a mesoporous film which is obtained.

A mesoporous film thus formed on the substrate is naturally dries in the air after it is cleaned with pure water, whereby a final film is obtained.

By removing surfactant micelles of a template from a mesoporous film fabricated as described above, it is possible to prepare a mesoporous film having hollow pores.

General methods can be used to remove a surfactant, and are selected from among baking, oxidation and decomposition by ozone formed by irradiation with ultraviolet light, extraction by a solvent, extraction by a fluid in a supercritical condition and the like.

For example, in the case of mesoporous silica, it is possible to completely remove a surfactant with hardly destructing the mesostructure by baking mesoporous silica in the air at 550° C. for ten hours.

It is preferred that the baking temperature and time be optimized by a material which forms pore walls and a surfactant which is used.

When a high molecular compound is prepared on the surface of a substrate in order to perform the orientation control of pores, a polymer film for orientation control which is present between a mesoporous film and the substrate is also removed by baking, with the result that the structure is such that the mesoporous film which has been orientation controlled is formed directly on the substrate.

When means of extraction by a solvent and the like are used, it is possible to form a mesoporous film on a substrate of a material which cannot withstand baking although 100% removal of a surfactant is difficult.

The removal of a surfactant is a step which is necessary only when a conjugated high molecular compound is introduced into pores after the removal of a surfactant from the pores, and this step is of course unnecessary when a mesoporous film is prepared by using a polymerizing surfactant, which is polymerized in pores.

Next, a film formation by the solvent evaporation method will be described.

In the solvent evaporation method, an aqueous solution, an organic solution or an organic solvent/water mixed solution, which contains a surfactant having concentrations which are not more than a critical micelle concentration and a precursor of an inorganic substance forming pore walls, is applied to a substrate by spin coating, dip coating, mist coating and the like. A mesostructure is formed with an increase in the concentration of the surfactant due to the drying of the solvent during coating.

Alcohols and the like are used as the organic solvent.

This method has the advantages that constraints to substrate materials are small because of relatively gentle reaction conditions, that the film preparation in a short time is possible and the like.

As a device for performing spin coating and dip coating, general ones can be used and there is no restriction. In some cases, however, means for controlling the temperature of a solution, means for controlling the temperature and humidity at which coating is performed may be provided.

A description will be given of a method of preparing a mesoporous film by use of dip coating, for example.

Figure 4:
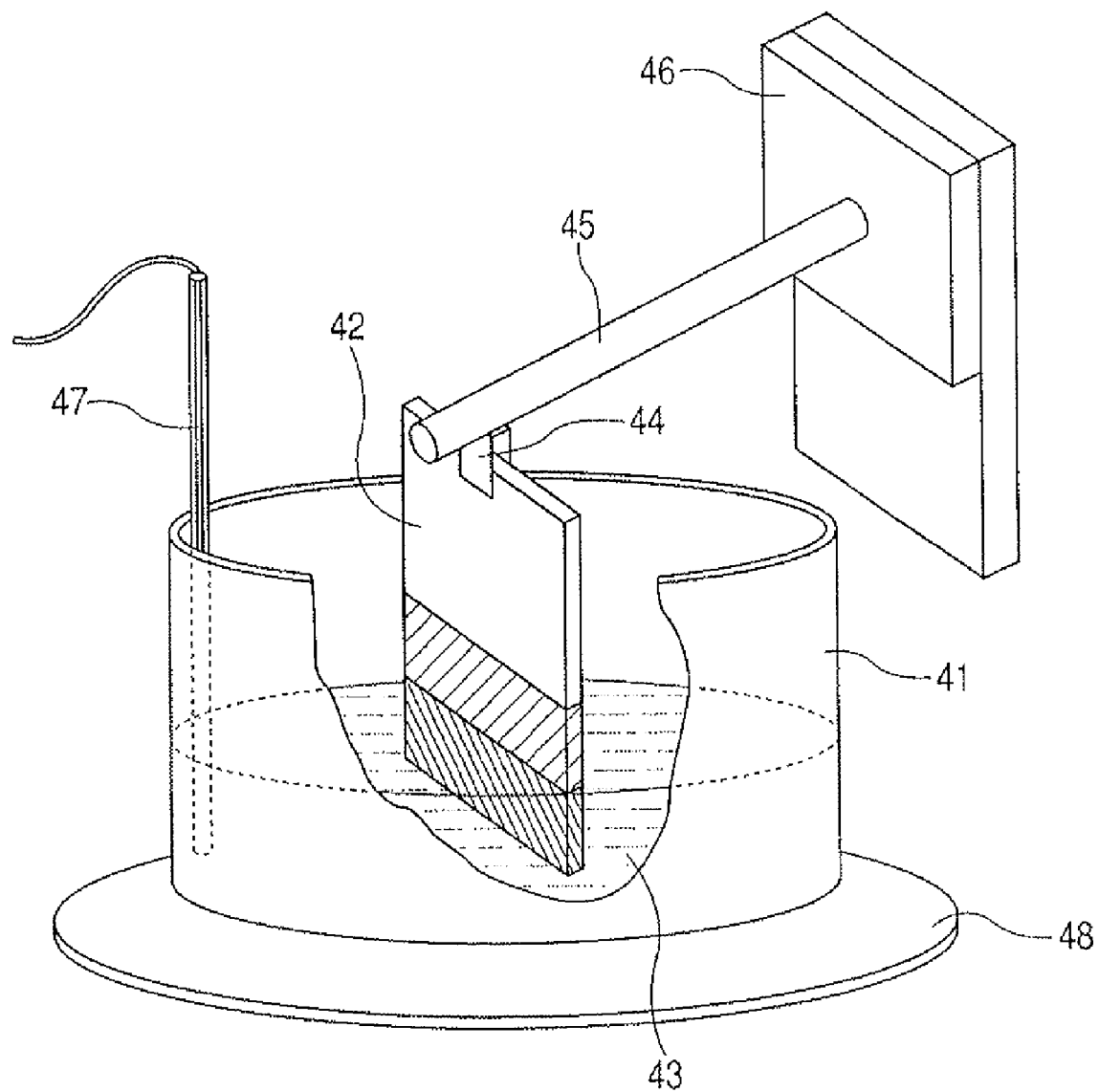
FIG. 4 is a schematic diagram of a film forming device which is used in the dip coating method among methods of preparing a mesoporous film by the solvent evaporation method.

An example of a device used in dip coating is schematically shown in FIG. 4.

In FIG. 4, the reference numeral 41 denotes a vessel, the reference numeral 42 denotes a substrate, and the reference numeral 43 denotes a precursor solution.

The precursor solution 43 is an aqueous solution, an organic solution or a mixed solution of an organic solution and water, which contains a surfactant having concentrations which are not more than a critical micelle concentration and a precursor of inorganic components, and in some cases, an acid or the like which acts as a hydrolysis and polycondensation catalyst may be added.

For example, a solution which is used in preparing mesoporous silica film, is obtained by dissolving a surfactant in an alcohol/water mixed solvent and adding an acid which is a hydrolysis catalyst to the solvent.

As in the preparation method by nonuniform nucleation-nucleus growth, a surfactant to be used is appropriately selected according to a method of introducing a conjugated high molecular compound into pores.

As will be described later in detail, when a method of introducing a conjugated high molecular compound into hollow pores after the removal of a surfactant in the pores is adopted, it is possible to use a broad range of surfactants, such as a cationic surfactant, for example, quaternary alkyl ammonium, and a nonionic surfactant containing polyethylene oxide as a hydrophilic group, and surfactants are not especially limited.

The length of the molecules of the surfactant to be used is determined according to the pore diameter of the aimed mesostructure, and additives such as mesitylene may be added in order to increase the diameter of the surfactant micelles.

On the other hand, in a case where a conjugated high molecular compound is formed by directly performing a polymerizing reaction by use of a surfactant having a polymerizing part, a surfactant which has a polymerizing part, a suitable hydrophoric group and a suitable hydrophilic group is used after it is designed and synthesized to suit the aimed pore structure.

Also in the latter case, it is possible to make a wide selection of structures of a polymerizing part and structures of a hydrophilic group which are to be used.

For the acid to be used, it is possible to use general acids, such as hydrochloric acid and nitric acid.

The substrate 42 on which a mesoporous film is to be prepared is fixed to a rod 45 by use of a holder 44 and moved up and down by use of a z-stage 46.

During film formation, the reaction solution 43 is controlled to a desired temperature by using a heater 48 and a thermocouple 47 as required.

In order to improve the controllability of the solution temperature, the whole vessel may sometimes be put in a heat insulating vessel which is not shown in the figure.

It is preferred that the substrate to which the reaction solution has been applied be dried in a device which permits the control of temperature and humidity.

Aging may sometimes be performed in a high humidity atmosphere after the drying step.

In addition to dip coating and spin coating, the pen-lithography method and the ink jet method described in "Nature," Vol. 405, p. 56 are also effective methods of preparing a mesoporous film based on the solvent evaporation method.

If these methods are used, it is possible to pattern a mesoporous film in desired places on a substrate.

In the pen-lithography method, a reaction solution is used as if it were ink, and the solution is applied from a pen tip to draw lines. By changing the pen shape, the moving speed of the pen and substrate, the fluid supply speed to the pen and the like, it is possible to freely change the line width and at present, it is possible to draw with line widths from the order of μm to the order of mm.

It is possible to draw arbitrary patterns of straight lines, curved lines and the like, planar patterning is also possible if it is ensured that the spreads of the reaction solution applied to the substrate overlap each other.

When discontinuous dot-like patterns are to be drawn, the ink jet method is more effective.

In this method, a reaction solution is used as if it were ink, and a given amount of the solution is discharged as liquid drops from an ink jet nozzle and applied.

If the reaction solution is applied in such a manner that the spreads of the reaction solution which reaches the substrate overlap each other, both linear patterning and planar patterning are possible.

Also in the case of a mesostructure film prepared by this solvent evaporation method, in the same manner as with a film prepared by nonuniform nucleation-nucleus growth, it is possible to prepare a mesoporous film having hollow pores by removing a surfactant from inside pores.

The removal of a surfactant is a step which is necessary only when a conjugated high molecular compound is introduced into pores after the removal of a surfactant from the pores, and this step is of course unnecessary when a mesoporous film is prepared by using a polymerizing surfactant, which is polymerized in pores.

When the formation of a mesoporous film is performed by the above-described methods by use of a substrate having structural anisotropy on the surface as described above, it is possible to form an oriented mesoporous film in which the direction of pores is controlled in one direction by the anisotropy of the substrate.

The pore structure of a mesoporous film of the present invention can be evaluated under a transmission electron microscope and by an X-ray diffraction analysis.

However, in the case of a mesoporous film of the present invention, tubular mesopores are formed parallel to the substrate and, therefore, it is necessary to use an in-plane X-ray diffraction analysis when orientations in the plane are to be evaluated.

When a mesoporous film having uniaxially-oriented tubular mesopores of the present invention is evaluated by in-plane X-ray diffraction, two diffraction peaks are observed at intervals of 180° in an in-plane rocking curve.

In a mesoporous film of the present invention, the orientation direction of pores is governed by the direction of anisotropy of a substrate, and the pores are often oriented, for example, in a direction perpendicular to the direction of rubbing treatment or the drawing-up direction of the substrate during LB film formation.

However, in some structures of a high molecular compound on the substrate or in some surfactants to be used, the pores may be oriented in a direction reverse to this direction, i.e., in a direction parallel to the direction of rubbing treatment or the drawing-up direction of the substrate during LB film formation.

A mesoporous film prepared in the present invention is characterized by having substantially uniform mesopores.

The size of pores and pore diameter distribution can be found from measurement results of an isothermal adsorption curve of nitrogen gas and the like.

In a mesoporous film of the present invention, the pore diameter distribution found from measurement results of an isothermal adsorption curve of nitrogen gas and the like by the Barrett-Joyner-Halenda (BJH) method has a single peak in the range of 2 nm to 50 nm, and in the found pore diameter distribution, not less than 60% of pores are included in a pore diameter range having a width of 10 nm.

As materials for pore walls of a mesoporous film used in the present invention, those containing oxides of silicon are preferably used.

Furthermore, silica and hybrid materials of silica and organic substances are preferably used.

Subsequently, a description will be given of methods of fabricating a structure in which a conjugated high molecular compound is held in pores of a mesoporous silica film prepared as described above.

The methods are broadly divided into two categories as will be described below.

However, methods other than these can be applied so long as they can form a structure in which a conjugated high molecular compound is held in pores.

For example, there is a method by which after a catalyst is carried within pores, a conjugated high molecular compound is polymerized in the pores.

In the first method, by causing heat or a polymerization initiator to act on a mesoporous film having uniaxially-oriented mesopores fabricated by use of a surfactant having a polymerizing part, a structure in which the surfactant is polymerized is made.

An optimum polymerization method is selected according to a polymerizing part of a surfactant to be used.

The polymerizing part of a surfactant used in this case is not especially restricted so long as it forms conjugated polymer chains by polymerization, and a diacetylene part, a pyrrole part, a thiophene part and the like can be enumerated as examples. However, the polymerizing part is not limited to them.

The hydrophilic group part is not especially restricted, and for example, a quaternary alkyl ammonium part, a polyethylene oxide part and the like can be used. However, the hydrophilic group part is not limited to them.

Generally, an alkyl group is used in the hydrophoric group.

In this method, a conjugated high molecular compound is immediately formed in pores by performing a polymerization reaction by use of an optimum technique.

In the second method, a mesoporous silica film having uniaxially-oriented tubular mesopores is prepared by use of a general surfactant and a conjugated high molecular compound is introduced into hollow mesopores of the mesoporous silica film formed by removing the surfactant from the pores.

For an example in which a conjugated polymer is introduced into pores of a mesoporous silica film, in which the orientation direction in the plane is controlled in one direction, there is a study by the present inventors, the contents of which are described in "Journal of the American Chemical Society," Vol. 126, pp. 4476-4477.

In this study, it is clearly shown that conjugated polymer chains are highly orientation controlled by introducing a conjugated high molecular compound into mesopores, which are controlled in one direction.

When a conjugated high molecular compound is introduced by this method, it is preferred that first, the inner surfaces of pores are subjected to hydrophobicizing treatment.

By making the interior of pores hydrophobic, the introduction of a conjugated high molecular compound into pores tends to become remarkably improved.

For example, by treating a film with phenyldimethyl-chlorosilane or 1,1,1,3,3,3-hexamethyl-disilazan, an organic substance is bonded to a silanol group in pores, whereby it is possible to efficiently hydrophobicize the interior of the pores.

However, substances used for the hydrophobicizing treatment of the interior of pores are not limited to them, and those other than the silane coupling agents can be used if similar effects can be obtained.

Concretely, the treatment of pore surfaces refers to such treatment that a mesoporous silica film is immersed in an aimed silane coupling agent, However, the method of modification is not limited to this, and for example, a method by which a reaction is caused in a gaseous phase is also applicable.

When a coupling reaction is performed, a substance which acts as a catalyst for the reaction may be added.

The catalyst to be added is, for example, trimethylsilane.

Subsequently to the hydrophobicizing treatment of the interior of pores, a conjugated high molecular compound is introduced into the pores.

It is possible to use various conjugated polymers.

For example, it is possible to use those having a polyphenylene vynilene skeleton, those having a polythiophene skeleton, those having a polypyrrole skeleton, those having a polyfluorene skeleton and the like. However, conjugated polymers are not limited to them.

As methods of introducing a conjugated high molecular compound into pores, it is possible to adopt several methods, such as a method by which the above-described mesoporous silica film having a pore structure which is orientation controlled is immersed in a solution of a conjugated high molecular compound, and a method by which a conjugated polymer solution is caused to drop onto a substrate and heated.

In the present invention, any method may be used so long as it can introduce a conjugated high molecular compound into pores.

In a case where a conjugated high molecular compound is introduced into pores by bringing the conjugated high molecular compound into contact with a solution of a polymer solution, an excessive conjugated high molecular material adheres to the outer surface of a film. Therefore, a process of removing this excessive conjugated high molecular material is performed.

By performing the above-described steps, it is possible to prepare a mesoporous silica film having tubular mesopores, which are uniaxially oriented and hold a conjugated high molecular compound in the pores, on a substrate.

The formation of a conjugated high molecular compound and the verification of orientation can be performed, for example, by the polarized light measurement in an ultraviolet to visible ray absorption analysis.

Next, a thin film of the present invention is patterned in order to make the structure of an element of the present invention.

Although the step of film patterning is described here after the preparation of a film having oriented conjugated molecular chains, the order of the process is not limited to this. For example, it is possible to adopt such an order that a mesoporous film is patterned by the following step, with a surfactant held within pores, and after that, a step of holding the above-described conjugated high molecular compound is performed.

In a case where in the solvent evaporation method, a pattern is formed beforehand by using the pen-lithography method and the ink jet method, the following patterning process is not always necessary.

A general method can be used in the patterning of a mesoporous film.

That is, a desired pattern can be formed by usual photolithography.

Concretely, a photoresist is applied to a film and exposure is performed by using a photomask for forming a desired film shape.

Next, after the development of the resist, the mesoporous film is patterned by etching.

For example, in the case of a mesoporous silica film, it is possible to perform etching by using HF—$NH_4F$ (buffered hydrofluoric acid).

Lastly, a patterned mesoporous film is obtained by removing the resist.

Next, two counter electrodes are prepared so that a magnetic field is applied to this patterned mesoporous film having oriented tubular mesopores in the direction of the pores.

The arrangement is as shown in FIGS. 1 and 2.

Also in the preparation of the electrodes, a general lithography method can be used.

In the above-described patterning process, the most frequently used method is such that with the resist not removed last, an electrode material is evaporated and after that, the evaporated metal is removed by a lift-off technique along with the above-described resist.

When a substrate having an electrically conductive part has also the function of the gate electrode as shown in FIG. 1, an electronic element of the present invention can be fabricated by the above-described process.

In the present invention, the conjugated polymer chains within a film are electrically insulated by the pore walls of silica from the gate electrode. However, as required, an insulating film may be separately formed.

When a gate electrode is formed in film form as shown in FIG. 2, an additional process for preparing the gate electrode is necessary.

Also this gate electrode can be formed by using a general photolithography technique or a processing device which uses the focused ion beam process and the like.

Also in this case, because a conjugated high molecular compound is covered with insulating pore walls, an electrode material can be directly formed.

The electronic element of the structure shown in FIG. 2 can be fabricated by the above-described process.

When a voltage is applied to across electrodes formed at both ends of an oriented mesoporous film of this element, which holds a conjugated high molecular compound in the pores, and an electric current observed is measured by changing the voltage applied to the gate electrode, a reversibly changing condition of the current flowing across the two electrodes is observed as the potential in the gate electrode changes and it is ascertained that the electronic element of the present invention functions as a field-effect transistor.

The present invention will be described in further detail by using embodiments. However, the present invention is not limited by the contents of the embodiments.

Embodiment 1

This embodiment is an example in which an electronic element schematically shown in FIG. 1 is fabricated by forming a mesoporous silica film having oriented tubular mesopores on a highly doped silicon substrate which is coated with polyimide subjected to rubbing treatment and by introducing polyhexyl thiophene into pores which have been made hollow by baking.

FIGS. 5A to 5E are diagrams which schematically show a process for fabricating the element of this embodiment. In FIGS. 5A to 5E, reference numeral 51 denotes a silicon substrate, reference numeral 52 denotes a polyimide film, reference numeral 53 denotes a mesoporous silica film, reference numeral 54 denotes a photoresist, reference numeral 55 denotes an electrode material, reference numerals 56 and 57 denote source and drain electrodes, and reference numeral 58 denotes a silicon oxide film.

An NMP solution of polyamic acid A was applied to a clean p type silicon (100) substrate having resistivity of 0.01 Ωcm and baked at 200° C. for 1 hour, whereby polyimide A having the following structure was formed. The film thickness of the polyimide A is 100 nm.

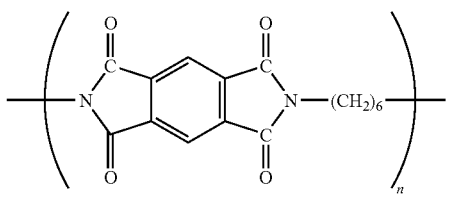

The polyimide was subjected to rubbing treatment under the conditions shown in Table 1 and used as the substrate.

TABLE 1

| Rubbing conditions for polyimide A | |
|---|---|
| Cloth material | Nylon |
| Roller diameter (mm) | 24 |
| Pressing depth (mm) | 0.4 |
| Number of revolutions (rpm) | 1000 |
| Stage speed (mm/min) | 600 |
| Number of repetitions | 2 |

A mesoporous silica film is formed on this substrate.

The surfactant used in this embodiment is polyoxyethylene-10-cetyl ethyl (abbreviated as $C_{16}EO_{10}$, trade name: Brij56), which is a nonionic surfactant.

After this surfactant was dissolved in pure water, hydrochloric acid and tetraethoxysilane were added so that the mole ratio of each component in a final solution became as follows: $TEOS:H_2O:HCl:C_{16}EO_{10}=0.10:100:3.0:0.10$.

The substrate coated with the above-described rubbing treated polyimide was held in this solution, with the substrate surface facing downward, at 80° C. for three days, and a mesoporous silica film was prepared.

The substrate taken out of the reaction solution was thoroughly cleaned with pure water and then air dried.

Upon the substrate, a transparent film was formed and a uniform interference color was observed.

This film was measured by an X-ray diffraction analysis and as a result, it was ascertained that the film has a 5.1 nm cyclic structure in the direction of the film thickness.

A section of this film was observed under a transmission electron microscope and as a result, it became apparent that in this film, tubular mesopores have a honeycomb packing structure.

Next, an in-plane X-ray diffraction analysis of this film was tried.

As a result, it was confirmed that the film has a 7.4 nm cyclic structure in the plane.

For the structure which gives this diffraction peak, an in-plane rocking curve was measured in order to investigate an orientation distribution in the plane.

As a result, two diffraction peaks at intervals of 180° were observed. It became apparent from this result that in the mesoporous silica film prepared in this embodiment, tubular pores are oriented in one direction.

The orientation direction was perpendicular to the direction of rubbing treatment.

The uniaxial orientation of the tubular mesopores was ascertained also by use of a transmission electron microscope, and it was ascertained that the pores are completely orientation controlled throughout the film with respect to the film thickness direction.

Next, this film was patterned. The patterning size is a rectangle 3 μm in width×200 μm in length.

First, a positive resist AZ-1500 was applied to the film under prescribed conditions, with the surfactant held in the pores, and exposure was performed by use of a photomask made in order to form a pattern of the above-described size.

The photoresist was developed and a resist pattern was prepared on the film.

As a result of an observation under an optical microscope, it was found that the same resist pattern as the pattern of the photomask had been formed on the film.

Figure 5A:
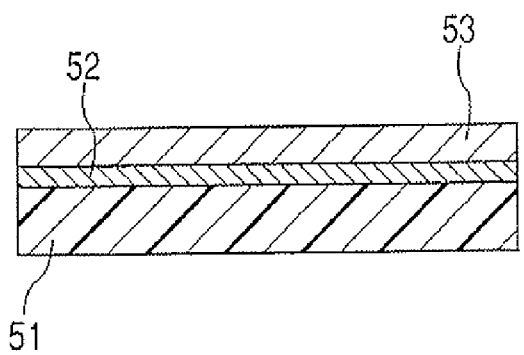
FIGS. 5A, 5B, 5C, 5D and 5E are schematic diagrams to explain a fabrication process of an element in Embodiment 1 of the present invention.
Figure 5B:
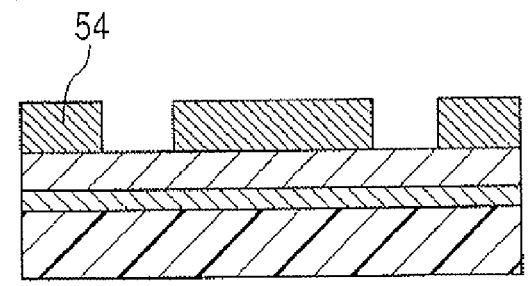

This resist pattern is schematically shown in FIG. 5B.

Figure 5C:
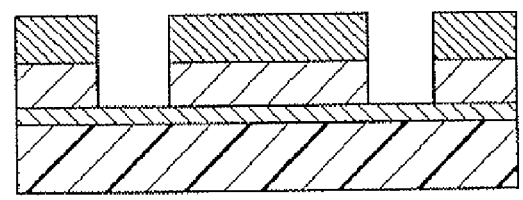

Next, the etching of the mesoporous silica film was performed by using this resist pattern as a mask (FIG. 5C).

The etching was performed by using a buffer solution of hydrofluoric acid ($NH_4F+HF$; $HF:NH_4F=1:5$).

It was ascertained that the mesoporous silica film is completely removed by etching for 30 seconds.

Figure 5D:
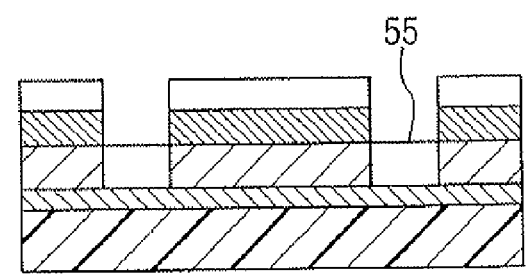
Figure 5E:
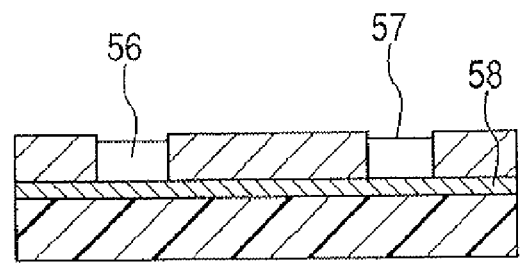

After the buffer solution of hydrofluoric acid was thoroughly cleaned and removed, this film was dried at 60° C. and an electrode metal was evaporated on the whole surface by the sputtering method (FIG. 5D).

In the evaporation step of the electrode metal, titanium is first evaporated in a film thickness of 5 nm and platinum is then evaporated in a film thickness of 300 nm.

After the completion of the evaporation of the electrode, the photoresist and the electrode material formed thereon were removed by a lift-off technique (FIG. 5F).

Because in this condition the surfactant is held in the pores, it is necessary to remove the surfactant before the introduction of a conjugated high molecular compound.

For this purpose, the film after the patterning was baked at 500° C. for five hours.

In this step, the polyimide film on the substrate is removed and a silicon oxide film which functions as a gate insulating film is formed on the silicon substrate.

The mesoporous silica film was patterned with a desired size as described above.

It was ascertained by an X-ray diffraction analysis that also after this patterning process, the structural regularity of mesoporous silica is maintained.

In order to obtain information on the pore diameter of this film, the film was baked, the surfactant was removed from the interior of the pores, and an adsorption isothermal curve of nitrogen gas was measured.

As a result, the adsorption showed a type IV behavior.

This result was analyzed by the Barrett-Joyner-Halenda (BJH) method and it was found that the pore diameter distribution of the mesoporous silica film prepared in this embodiment is a narrow distribution having a single peak at 3.2 nm and that not less than 80% of the pores are in a 10 nm distribution.

This can be ascertained also in a mesoporous film which is not patterned.

This mesoporous silica film for which a hollow pore structure has been made by baking is first subjected to silane coupling treatment, whereby the surfaces of the pores are hydrophobicized.

Concretely, the film immediately after the baking was immersed in a mixture of trimethyl-chlorosilane and 1,1,1,3,3,3-hexamethyl-disilazan at a ratio of 1:1 for 2 hours, cleaned with ethanol to remove an excessive silane coupling agent, and then dried.

Subsequently to this, a conjugated high molecular compound is introduced into the pores.

The conjugated high molecular compound introduced in this embodiment is 9.9-dioctylfluorene-co-bithiophene, which is known as F8T2.

Then 0.3 g of F8T2 was dissolved in 10 ml of chlorobenzene, and the above-described oriented mesoporous silica film was held in this solution at 80° C. for 3 days.

After that, the mesoporous silica film was taken out of the solution and excessive F8T2 adhering to the external surface was cleaned with chloroform and removed, and the mesoporous silica film was dried at room temperature.

F8T2 could be introduced into the pores by the process described above.

This can be ascertained by measuring the polarized absorption spectrum of the film after the introduction of F8T2 in the reflection/transmission mode.

That is, the F8T2 which is held in the oriented pores shows a strong absorption-polarization dependence, and absorption derived from the conjugated high molecular compound was observed only when the direction of polarization was parallel to the orientation direction of the pores.

This shows that the molecular chains of the conjugated high molecular compound are orientation controlled in one direction by the pores of high anisotropy.

An element of the structure schematically shown in FIG. 1 was fabricated by the process described above.

In this element, by applying a voltage across electrodes formed at both ends of the film, a current flowing across the electrodes was measured, with a voltage applied to the substrate functioning as the gate electrode being changed.

As a result, the current across the electrodes was observed to behave so as to increase with increasing voltage which is applied to the substrate, and it was ascertained that the electronic element fabricated in this embodiment functions as a field-effect transistor.

Embodiment 2

This embodiment is an example in which as with Embodiment 1, by use of a substrate which is coated with a polyimide film subjected to rubbing treated, a mesoporous silica film, the pore direction of which is orientation controlled in one direction on the substrate, is prepared by dip coating based on the sol-gel method and after the introduction of polyhexyl thiophene into the pores, each electrode for the source, drain and gate is formed by the focused ion beam (FIB) process and a field-effect transistor is fabricated.

FIGS. 6A to 6E are diagrams which schematically show a process for fabricating the element of this embodiment. In FIGS. 6A to 6E, reference numeral 61 denotes a mesoporous silica film, reference numeral 62 denotes a void, reference numerals 63 and 64 denote source and drain electrodes, and reference numeral 65 denotes a gate electrode.

Polyamic acid A, which is the same precursor solution of polyimide A as used in Embodiment 1, is applied to a quartz glass substrate which has been thoroughly cleaned with acetone, isopropyl alcohol and pure water and the surface of which has been UV/ozone treated, and a polyimide film was formed by the same heat treatment as in Embodiment 1.

This substrate was subjected to rubbing treatment by use of the same apparatus as with Embodiment 1 under the same conditions as in Embodiment, and used as the substrate for preparing a mesoporous silica film.

A mesoporous silica film is formed on this substrate by the dip coating method.

Also in this embodiment, $C_{16}EO_{10}$, the same surfactant as in Embodiment 1, was used in preparing the mesoporous silica film.

The composition of the precursor solution which was used was adjusted so as to obtain: $C_{16}EO_{10}$ 0.08:TEOS 1.0:EtOH 22:$H_2O$ 5:HCl 0.004.

The above-described substrate was immersed in this precursor solution and drawn up at a speed of 3 mm/sec.

This film was held in an atmosphere of 40° C. to 50% for 24 hours and a mesoporous silica film which holds the surfactant in pores was prepared.

A uniform film was formed on the substrate and a uniform interference color was observed.

This film was measured by an X-ray diffraction analysis and as a result, it was ascertained that the film has a 4.6 nm cyclic structure in the direction of the film thickness.

A section of this film was observed under a transmission electron microscope and as a result, it became apparent that in this film, tubular mesopores have a honeycomb packing structure.

An in-plane X-ray diffraction analysis of this film was tried. As a result, it was confirmed that the film has a 7.2 nm cyclic structure in the plane.

For the structure which gives this diffraction peak, an in-plane rocking curve was measured in order to investigate an orientation distribution in the plane.

As a result, two diffraction peaks at intervals of 180° were observed. It became apparent from this result that in the mesoporous silica film prepared in this embodiment, tubular pores are oriented in one direction.

The half-width of the peaks of the in-plane rocking curve was smaller than in the film prepared in Embodiment 1 and it became apparent that the orientation distribution in the plane is narrow.

The orientation direction was perpendicular to the direction of rubbing treatment, and this is the same as in the case of the mesoporous silica film of Embodiment 1.

The uniaxial orientation of the tubular mesopores was ascertained also by use of a transmission electron microscope, and it was ascertained that the pores are completely orientation controlled throughout the film with respect to the film thickness direction.

In order to obtain information on the pore diameter of this film, the film was baked at 500° C. for six hours, the surfactant was removed from inside the pores, and an adsorption isothermal curve of nitrogen gas was measured.

As a result, the adsorption showed a type IV behavior.

This result was analyzed by the BJH method and it was found that the pore diameter distribution of the mesoporous silica film prepared in this embodiment is a narrow distribution having a single peak at 3.0 nm and that not less than 80% of the pores are in a 10 nm distribution.

It has been ascertained that in this film, the pore structure in the plane does not change although the shrinkage of the structure occurs in the film thickness direction due to baking.

The degree of shrinkage in the in-plane direction was greater than with the film prepared in Embodiment 1.

Subsequently, this film was treated with a silane coupling agent under the same conditions as described in Embodiment 1 and the inner walls of the pores were hydrophobicized.

Next, poly-3-hexylthiophene, which is a conjugated high molecular compound, is introduced into the pores of the oriented mesoporous silica which has been hydrophobicized.

Then 0.3 g of poly-3-hexylthiophene was dissolved in 10 ml of chlorobenzene, and the above-described oriented mesoporous silica film was held in this solution at 80° C. for 3 days.

After that, the mesoporous silica film was taken out of the solution and excessive poly-3-hexylthiophene adhering to the external surface was cleaned with chloroform and removed, and the mesoporous silica film was dried at room temperature.

Although the mesoporous silica film after the introduction of poly-3-hexylthiophene was colored in dark purple, the transparency and the like of the film was maintained.

Poly-3-hexylthiophene could be introduced into the oriented mesoporous silica pores prepared by dip coating in this embodiment by the process described above.

This can be ascertained by measuring the polarized absorption spectrum of the film after the introduction of poly-3-hexylthiophene.

That is, the poly-3-hexylthiophene which is held in the oriented pores shows a strong absorption-polarization dependence, and absorption derived from the conjugated high molecular compound was observed only when the direction of polarization was parallel to the orientation direction of the pores.

This shows that the molecular chains of the conjugated high molecular compound are orientation controlled in one direction by the pores of high anisotropy.

Figure 6A:
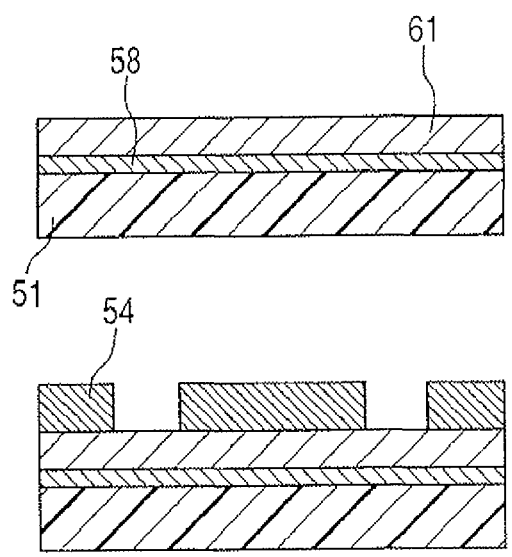
FIGS. 6A, 6B, 6C, 6D, 6E and 6F are schematic diagrams to explain a fabrication process of an element in Embodiment 2 of the present invention.
Figure 6B:
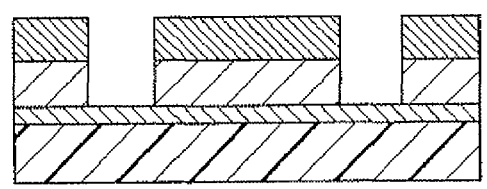
Figure 6C:
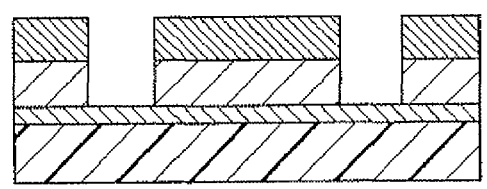

Next, this film was patterned with the same shape as in Embodiment 1 by the same method described in Embodiment 1 (FIGS. 6A to 6C).

Figure 6D:
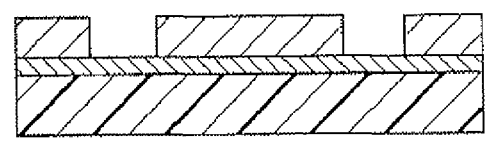

In this embodiment, however, the photoresist was removed after the removal of the mesoporous silica film by etching (FIG. 6D).

Figure 6E:
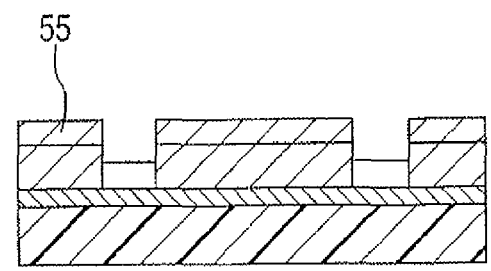

Subsequently to this, an electrode material was formed on the whole surface of the element as shown in FIG. 6E The film formation of the electrode material was performed by the sputtering method, and platinum was evaporated in a film thickness of 300 nm after the evaporation of titanium in a film thickness of 5 nm.

Figure 6F:
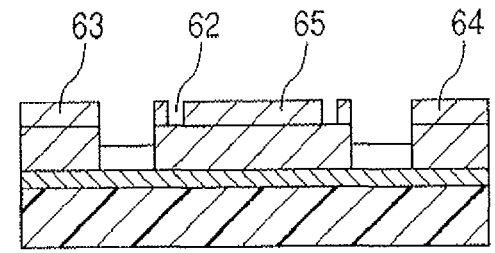

Lastly, as shown in FIG. 6F, in order to separate electrodes performing the functions of the gate, source and drain, processing was performed by using the focused ion beam (FIB) process.

In this case, the poly-3-hexylthiophene in the mesoporous silica pores is electrically separated from the gate electrode by the insulating pore walls of mesoporous silica and, therefore, it is unnecessary to provide a gate insulating film. However, an insulating film which is not shown in the figure may be formed.

The element of the structure schematically shown in FIG. 2 was fabricated by the process described above.

In this element, by applying a voltage across electrodes formed at both ends of the film, a current flowing across the electrodes was measured, with a voltage applied to the gate electrode being changed.

As a result, the current across the electrodes was observed to behave so as to increase with increasing voltage which is applied to the gate electrode, and it was ascertained that the electronic element fabricated in this embodiment functions as a field-effect transistor.

Embodiment 3

This embodiment is an example in which, by use of a surfactant having a polymerizing part, a mesoporous silica film having uniaxially oriented tubular mesopores is prepared on a low-resistivity silicon substrate used in Embodiment 1, on which a polyimide film subjected to rubbing treated is formed, an oriented conjugated high molecular compound is prepared in pores by the polymerization of the surfactant in the pores, after that, this film is patterned and electrodes are formed, whereby an electronic element of the structure shown in FIG. 2 is fabricated.

First, in the same procedure as in Embodiment 1, a film of polyimide A was formed on the substrate and subjected to rubbing treatment under the same conditions as in Embodiment 1.

A surfactant having a diacetylene part of the structure $C_{11}H_{23}$—C≡C—C≡$CH_2$—$N^+(CH_3)_3$ as a polymerizable part was synthesized, and an oriented mesoporous silica film was prepared by using this surfactant in a template.

The preparation of the mesoporous silica film was performed by the method based on nonuniform nucleation-nucleus growth as in Embodiment 1.

After the above-described surfactant was dissolved in pure water, hydrochloric acid and tetraethoxysilane were added so that the mole ratio of each component in a final solution became as follows: TEOS:$H_2O$:HCl:surfactant=0.125:100: 8.0:0.10.

The substrate coated with the above-described rubbing treated polyimide was held in this solution, with the substrate surface facing downward, at 80° C. for three days, and a mesoporous silica film was prepared.

The substrate taken out of the reaction solution was thoroughly cleaned with pure water and then air dried.

Upon the substrate, a transparent film was formed and a uniform interference color was observed.

This film was measured by an X-ray diffraction analysis and as a result, it was ascertained that the film has a 3.5 nm cyclic structure in the direction of the film thickness.

A section of this film was observed under a transmission electron microscope and as a result, it became apparent that in this film, tubular mesopores have a honeycomb packing structure.

Also for this film, an in-plane X-ray diffraction analysis was tried. An in-line rocking curve was measured for observed in-plane X-ray diffraction peaks. As a result, two diffraction peaks at intervals of 180° were observed. It became apparent from this result that in the mesoporous silica film prepared in this embodiment, tubular pores are oriented in one direction.

The orientation direction was perpendicular to the direction of rubbing treatment.

The uniaxial orientation of the tubular mesopores was ascertained also by use of a transmission electron microscope, and it was ascertained that the pores are completely orientation controlled throughout the film with respect to the film thickness direction.

Next, this film was annealed and the surfactant held in the pores was polymerized.

As a result, the diacetylene part of the surfactant is polymerized, thereby forming a conjugated high molecular compound in the pores.

The confirmation of the polymerization was performed based on the fact that in an infrared absorption spectrum, an absorption peak of 2260 cm$^{-1}$ ascribed to the stretching vibration of a carbon-carbon triple bond disappears after the annealing.

The polarized absorption spectrum of the film after the polymerization was measured. As a result, absorption was observed only when the direction of polarization is parallel to the orientation direction of the pores, and it was ascertained that polymer chains are oriented in the pores.

Figure 7A:
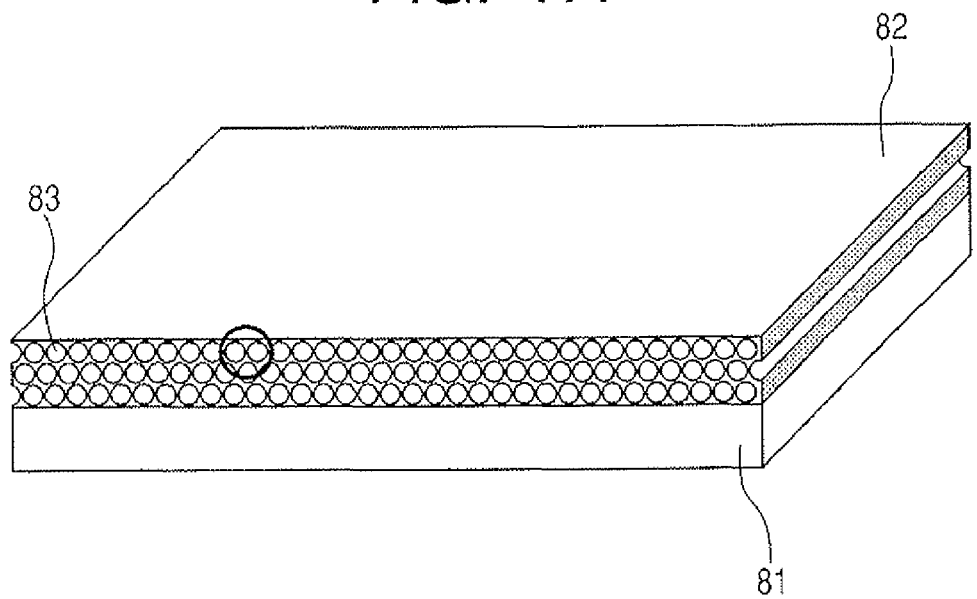
FIGS. 7A and 7B are schematic diagrams which respectively show a mesoporous silica film having oriented conjugated polymer chains within pores, which is prepared by using a surfactant having a polymerizing part, in Embodiment 3 of the present invention, and a partially enlarged portion of the mesoporous silica film.
Figure 7B:
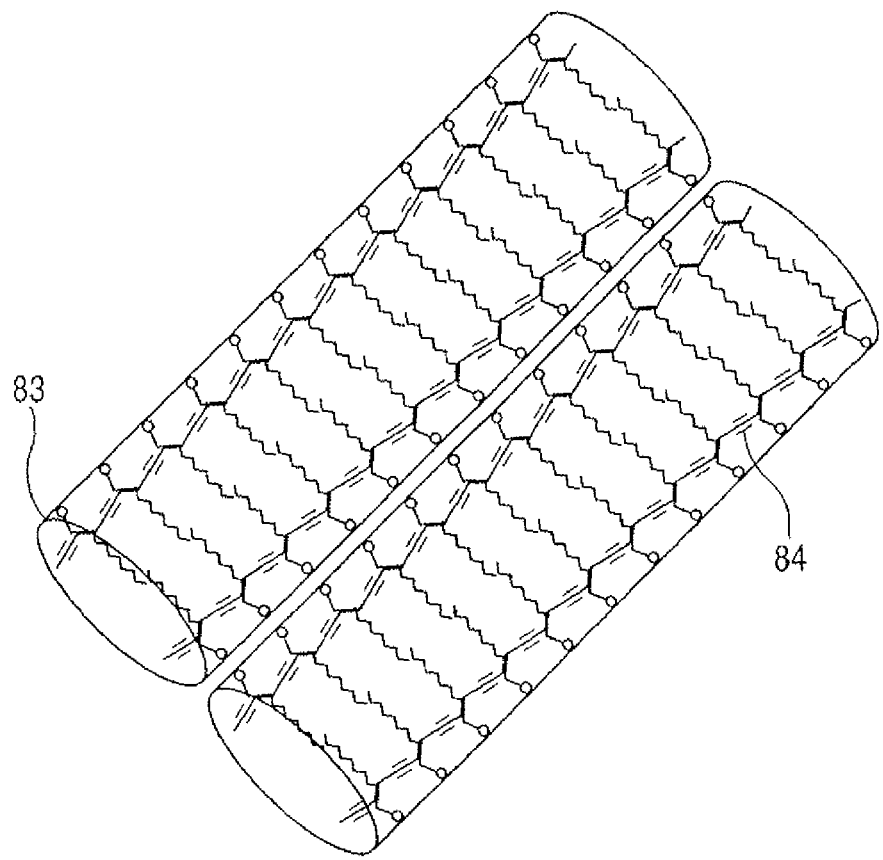

This polymerization is schematically shown in FIGS. 7A and 7B. In FIGS. 7A and 7B, reference numeral 81 denotes a substrate, reference numeral 82 denotes a mesoporous silica film, reference numeral 83 denotes a pore, and reference numeral 84 denotes a conjugated high molecular compound.

The conjugated high molecular compound in which the surfactant is polymerized is oriented in the pores.

Next, this film was patterned by the same process as in Embodiment 1, and electrodes were formed. However, the removal of the photoresist was performed by using isopropyl alcohol.

In this case, as in Embodiment 1, the silicon gate has the function of the gate electrode.

An element of the structure schematically shown in FIG. 2 was fabricated by the above-described process.

In this element, by applying a voltage across electrodes formed at both ends of the film, a current flowing across the electrodes was measured, with a voltage applied to the substrate functioning as the gate electrode being changed.

As a result, the current across the electrodes was observed to behave so as to increase with increasing voltage which is applied to the substrate, and it was ascertained that the electronic element fabricated in this embodiment functions as a field-effect transistor.

Although the mode of this embodiment is limited to a transistor, the present invention is not limited to this. For example, if the configuration of a transistor is such that changes in gate potential can be monitored as a current across the source and the drain when a substance has been adsorbed in the gate portion, then it is also possible to use the element as a sensor.

It might be thought that the transistor could be used in general applications.

The present invention relates to a novel organic semiconductor element which utilizes the main-chain transmission of a conjugated high molecular compound which is orientation controlled at a molecular level.

This application claims priority from Japanese Patent Application No. 2005-152465 filed May 25, 2005, which is hereby incorporated by reference herein.

What is claimed is:

1. A method of manufacturing an electronic element comprising a pair of electrodes formed on a substrate, a mesoporous film having tubular mesopores oriented in one direction, the mesoporous film being formed between the pair of electrodes so as to be in contact with the pair of electrodes, a conjugated high molecular compound held in the tubular mesopores, and a third electrode which is electrically insulated from the conjugated high molecular compound and formed so as to be in contact with the mesoporous film, the method comprising a step of forming the conjugated high molecular compound in the tubular mesopores, which step comprises:
(i) a step of forming the mesoporous film which is made up so as to contain tubular molecular assemblies of a surfactant having a uniform diameter, which are oriented in one direction;
a step of removing the surfactant from the tubular mesopores of the mesoporous film;
a step of performing treatment so that surfaces of the tubular mesopores after removal of the surfactant obtain hydrophobicity; and
a step of introducing the conjugated high molecular compound subsequently to the hydrophobicizing treatment; and
(ii) a step of forming the pair of electrodes and the third electrode.

2. The method according to claim 1, wherein the orientation direction of the tubular mesopores is parallel to the direction of an electric field when an electrical potential is applied across the pair of electrodes.

3. The method according to claim 1, wherein the electronic element is a field-effect transistor which controls the amount of a current flowing across the pair of electrodes by an electrical potential applied to the third electrode.

4. The method according to claim 3, wherein a material for the mesoporous film is silica.

5. The method according to claim 3, wherein a material for the mesoporous film is a hybrid material of silica and an organic substance.

6. The method according to claim 1, wherein a material for the mesoporous film contains a silicon oxide.

7. The method according to claim 1, wherein at least a portion of the substrate is a substrate having electrical conductivity and the substrate serves also as the third electrode.

8. A method of manufacturing a field-effect transistor, comprising steps of:
forming a mesoporous silica film having tubular mesopores on a substrate, the mesopores having a substantially uniform diameter and being oriented in one direction;
forming a conjugated high molecular compound in the tubular mesopores;
patterning by wet etching the mesoporous silica film having the tubular mesopores holding the conjugated high molecular compound formed therein;
forming a source electrode and a drain electrode so that an electric field is applied to the patterned mesoporous silica film in the direction parallel to the oriented tubular mesopores; and
forming a gate electrode so as to be electrically insulated from the conjugated high molecular compound and in contact with the mesoporous silica film.

9. The method according to claim 8,
wherein the step of forming a mesoporous silica film on a substrate comprises forming mesoporous silica film including molecular assemblies of a surfactant, the molecular assemblies having a substantially uniform diameter and being oriented in one direction, and
wherein the step of forming a conjugated high molecular compound in the tubular mesopores includes:
removing the surfactant from the tubular mesopores;
performing hydrophobic treatment to obtain hydrophobicity on the tubular mesopores after removing the surfactant; and
introducing the conjugated high molecular compound into the tubular mesopores subsequently to the hydrophobic treatment.

10. A method of manufacturing a field-effect transistor, comprising steps of:

preparing a substrate which has an electrically conductive part in at least a portion of a surface thereof;

forming a mesoporous silica film on the electrically conductive part of the substrate, the mesopores having a substantially uniform diameter and being oriented in one direction;

forming a conjugated high molecular compound in the tubular mesopores of the mesoporous silica film formed on the substrate;

patterning by wet etching the mesoporous silica film having the tubular mesopores holding the conjugated high molecular compound formed therein; and forming a source electrode and a drain electrode so that an electric field is applied to the patterned mesoporous silica film in the direction parallel to the oriented tubular mesopores.

* * * * *

UNITED STATES PATENT AND TRADEMARK OFFICE
Certificate

Patent No. 7,888,170 B2

Patented: February 15, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Hirokatsu Miyata, Hadano (JP); Yohei Ishida, Kawasaki (JP); Yasuhiro Kawashima, Tokyo (JP); and Sarah H. Tolbert, Los Angeles, CA (US).

Signed and Sealed this Eleventh Day of June 2013.

MATTHEW W. SUCH
*Supervisory Patent Examiner*
Art Unit 2896
Technology Center 2800